(12) United States Patent
Shang et al.

(10) Patent No.: US 6,843,258 B2
(45) Date of Patent: Jan. 18, 2005

(54) ON-SITE CLEANING GAS GENERATION FOR PROCESS CHAMBER CLEANING

(75) Inventors: Quanyuan Shang, Saratoga, CA (US); Sanjay Yadav, Redwood City, CA (US); William R. Harshbarger, San Jose, CA (US); Kam S. Law, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/741,529

(22) Filed: Dec. 19, 2000

(65) Prior Publication Data

US 2002/0074013 A1 Jun. 20, 2002

(51) Int. Cl.[7] ................................................. B08B 9/00

(52) U.S. Cl. .................... 134/22.1; 134/1.1; 134/22.18; 134/34; 134/19; 134/37; 134/902; 216/63; 216/67; 216/69; 438/905; 205/411

(58) Field of Search ................................. 134/1.1, 22.1, 134/22.18, 34, 19, 37, 902, 3, 8, 10, 11, 12, 31; 216/63, 67, 69; 438/905; 205/411, 334, 359, 556, 357

(56) References Cited

U.S. PATENT DOCUMENTS

| | | | |
|---|---|---|---|
| 2,879,212 A | 3/1959 | Hill et al. ................... | 204/60 |
| 3,146,179 A | 8/1964 | Davies ........................ | 204/60 |
| 3,684,667 A | 8/1972 | Sayce ......................... | 204/60 |
| 3,976,447 A | 8/1976 | Merchant et al. ............ | 55/71 |
| 4,125,443 A | 11/1978 | Grant et al. ................. | 204/60 |
| 4,176,018 A | 11/1979 | Faron ......................... | 204/60 |
| 4,312,718 A | 1/1982 | Watanabe et al. ........... | 204/60 |
| 4,498,953 A | 2/1985 | Cook et al. ................. | 156/646 |
| 4,818,326 A | 4/1989 | Liu et al. .................... | 156/345 |

(List continued on next page.)

FOREIGN PATENT DOCUMENTS

| | | | |
|---|---|---|---|
| DE | 429809 | 6/1926 | |
| EP | 0697467 | 2/1996 | ........... C23C/16/44 |
| EP | 0819780 | 1/1998 | |
| EP | 0965661 | 12/1999 | ............. C25B/9/00 |
| EP | 1076355 | 2/2001 | ........... H01L/21/00 |
| JP | 51091673 | 8/1976 | |
| JP | 3077786 | 4/1991 | |
| JP | 04311570 | 11/1992 | |
| JP | 5-109673 | 4/1993 | |
| JP | 6033054 | 2/1994 | |
| JP | 6080962 | 3/1994 | |
| JP | 08017804 | 1/1996 | ....... H01L/21/3065 |
| JP | 8060368 | 5/1996 | |
| WO | WO-99/02754 | 1/1999 | |
| WO | 99/06611 | 2/1999 | |
| WO | 99/28538 | 6/1999 | |
| WO | 0051938 | 9/2000 | ............. C01B/7/24 |
| WO | 00/52740 | 9/2000 | ........... H01L/21/00 |

OTHER PUBLICATIONS

Condense Chemical Dictionary by R. Lewis, Sr. Van Nostrand Reinhold, 1993. p. 614.*

"Seventh Generation PECVD System Announced Overcoming Obstacles to Increase the Substrate Size" *AKT News Excerpt; Electronic Journal*, Nov., 2003.

(List continued on next page.)

*Primary Examiner*—M. Kornakov
(74) *Attorney, Agent, or Firm*—Moser, Patterson & Sheridan, LLP

(57) ABSTRACT

Provided herein is a method for cleaning a process chamber for semiconductor and/or flat panel display manufacturing. This method comprises the steps of converting a non-cleaning feed gas to a cleaning gas in a remote location and then delivering the cleaning gas to the process chamber for cleaning. Such method may further comprise the step of activating the cleaning gas outside the chamber before the delivery of the gas to the chamber. Also provided is a method of eliminating non-cleaning feed gas from the cleaning gas by cryo condensation.

20 Claims, 2 Drawing Sheets

U.S. PATENT DOCUMENTS

| | | | |
|---|---|---|---|
| 4,867,841 A | 9/1989 | Loewenstein | 156/646 |
| 4,900,395 A | 2/1990 | Syverson et al. | 156/639 |
| 4,960,488 A | 10/1990 | Law et al. | 156/643 |
| 5,002,632 A | 3/1991 | Loewenstein et al. | 156/643 |
| 5,129,958 A | 7/1992 | Nagashima et al. | 134/22.1 |
| 5,180,466 A | 1/1993 | Shin | 156/643 |
| 5,207,836 A | 5/1993 | Chang | 134/1 |
| 5,284,605 A * | 2/1994 | Nicolas | 423/240 R |
| 5,298,112 A | 3/1994 | Hayasaka et al. | 156/643 |
| 5,336,832 A | 8/1994 | Keller | 585/710 |
| 5,366,585 A | 11/1994 | Robertson et al. | 156/643 |
| 5,378,324 A | 1/1995 | Hodgson | 204/60 |
| 5,405,491 A | 4/1995 | Shahvandi et al. | 156/643 |
| 5,406,008 A * | 4/1995 | Sievert | 570/123 |
| 5,425,842 A | 6/1995 | Zijlstra | 438/761 |
| 5,449,411 A | 9/1995 | Fukuda et al. | 118/723 E |
| 5,534,107 A | 7/1996 | Gray et al. | 156/643.1 |
| 5,549,802 A | 8/1996 | Guo | 204/298.11 |
| 5,565,038 A | 10/1996 | Ashley | 134/2 |
| 5,569,151 A * | 10/1996 | Karwacki et al. | 137/264 |
| 5,597,495 A | 1/1997 | Keil et al. | 216/66 |
| 5,620,526 A | 4/1997 | Watatani et al. | 134/1.1 |
| 5,628,894 A * | 5/1997 | Tarancon | 205/359 |
| 5,679,215 A | 10/1997 | Barnes et al. | 156/646.1 |
| 5,685,916 A | 11/1997 | Ye et al. | 134/1.1 |
| 5,688,384 A | 11/1997 | Hodgeson et al. | 204/229 |
| 5,693,147 A | 12/1997 | Ward et al. | 134/1.1 |
| 5,705,080 A | 1/1998 | Leung et al. | 216/67 |
| 5,756,400 A | 5/1998 | Ye et al. | 438/710 |
| 5,762,813 A | 6/1998 | Takiyama et al. | 216/67 |
| 5,779,866 A * | 7/1998 | Tarancon | 204/262 |
| 5,788,778 A * | 8/1998 | Shang et al. | 134/1 |
| 5,788,799 A | 8/1998 | Steger et al. | 156/345 |
| 5,824,607 A | 10/1998 | Trow et al. | 118/723 MA |
| 5,844,195 A | 12/1998 | Fairbairn et al. | 219/121.43 |
| 5,846,886 A | 12/1998 | Hattori et al. | 438/740 |
| 5,849,092 A | 12/1998 | Xi et al. | |
| 5,849,639 A | 12/1998 | Molloy et al. | 438/714 |
| 5,872,061 A | 2/1999 | Lee et al. | 438/705 |
| 5,880,031 A | 3/1999 | Wong | 438/706 |
| 5,880,032 A | 3/1999 | Doi et al. | 438/706 |
| 5,888,309 A | 3/1999 | Yu | 134/1.2 |
| 5,904,566 A | 5/1999 | Tao et al. | 438/689 |
| 5,935,874 A | 8/1999 | Kennard | 438/710 |
| 5,958,801 A | 9/1999 | Langley | 438/738 |
| 5,970,376 A | 10/1999 | Chen | 438/637 |
| 5,980,769 A | 11/1999 | Yanagisawa et al. | 216/67 |
| 6,007,733 A | 12/1999 | Jang et al. | 216/80 |
| 6,014,979 A | 1/2000 | Van Autryve et al. | |
| 6,015,761 A | 1/2000 | Merry | 438/723 |
| 6,020,035 A | 2/2000 | Gupta et al. | 427/534 |
| 6,024,887 A | 2/2000 | Kuo et al. | 216/48 |
| 6,024,888 A | 2/2000 | Watanabe et al. | 216/73 |
| 6,029,718 A | 2/2000 | Jackson et al. | 141/231 |
| 6,051,505 A | 4/2000 | Chu et al. | 438/710 |
| 6,055,927 A | 5/2000 | Shang | 118/723 E |
| 6,109,206 A | 8/2000 | Mayden et al. | 118/723 IR |
| 6,117,793 A | 9/2000 | Tang | 438/740 |
| 6,125,859 A | 10/2000 | Kao et al. | 134/1.1 |
| 6,159,333 A | 12/2000 | Gupta et al. | 156/345 |
| 6,209,483 B1 * | 4/2001 | Dyer | 118/723 ME |
| 6,255,222 B1 | 7/2001 | Xia et al. | 216/60 |
| 6,264,852 B1 | 7/2001 | Herchen et al. | 216/60 |
| 6,271,148 B1 | 8/2001 | Kao et al. | 438/727 |
| 6,286,451 B1 | 9/2001 | Ishikawa et al. | 118/723 I |
| 6,352,081 B1 | 3/2002 | Lu et al. | 134/22.1 |
| 6,362,031 B1 | 3/2002 | Yamaguchi et al. | 438/158 |
| 6,366,346 B1 * | 4/2002 | Nowak et al. | 216/60 |
| 6,366,366 B1 | 4/2002 | Nakamura | 358/487 |
| 6,374,831 B1 | 4/2002 | Chandran et al. | 134/1.1 |
| 6,379,575 B1 | 4/2002 | Yin et al. | 216/67 |
| 6,387,288 B1 | 5/2002 | Bjorkman et al. | 216/67 |
| 6,500,356 B2 | 12/2002 | Goto et al. | 216/72 |
| 6,544,345 B1 | 4/2003 | Mayer et al. | 134/28 |
| 6,602,433 B1 | 8/2003 | Bhardqaj et al. | 216/37 |
| 2003/0010354 A1 | 1/2003 | Goto et al. | 134/1.1 |
| 2003/0098038 A1 | 5/2003 | Siegele et al. | 134/1.1 |
| 2003/0109144 A1 | 6/2003 | Goto et al. | 438/734 |
| 2003/0121796 A1 | 7/2003 | Siegele et al. | 205/556 |
| 2003/0192569 A1 | 10/2003 | Goto et al. | |

OTHER PUBLICATIONS

Foon, Ruby; "Kinetics of Gaseous Fluorine Reactions" *Prog. Reaction Kinetics*, 1975, vol. 8, No. 2, pp. 81–160 Pergamon Press, Printed in Great Bitain.

Wang, X., et al, "Gas Phase Silicon Etching with Bromine Trifluoride," Transducers, 1997, Conference on Solid–State Sensors and Actuators.

International Sematech, "Motorola Evaluation of the Applied Science and Technology, Inc. (ASTeX) Astron Technology for Perfluorocompound (PFC) Emmissions Reductions on the Applied Materials DxL Chemical Vapor Deposition (CVD) Chamber", Apr. 16, 1999.

Astron, "Reactive Gas Generators," MKS Instruments, Inc., 2003.

Flamm, et al., "Reaction of Fluorine Atoms with $SiO_2$," J. Appl. Phys., Oct. 1979 50 (10), 6211–13.

Mucha, et al., "Chemiluminescent Reaction of $SiF_2$ with Fluorine and the Etching of Silicon by Atomic and Molecular Fluorine," J. Appl. Phys. 53(6) 4553–54, 1982.

Donnelly, et al., Studies of chemiluminescence accompanying fluorine atom etching of silicon; J. Appl. Phys., 51 (190) (Oct. 1980) 5273–76.

Flamm, et al., "The reaction of fluorine atoms with silicon," J. Appl. Phys. 52 (5) (May 1981) 3633–39.

Flamm, et al., "$XeF_2$ and F–atom reactions with Si; their significance for plasma etching," Solid State Technology (Apr. 1993) 117–121.

Ibbotson, D.E., et al., "Comparison of $XeF_2$ and F–Atom Reactions with Sl and $SiO_2$," Mar. 28, 1994.

Aliev, V.S., et al., "Development of Si (100) Surface Roughness at the Initial Stage of Etching in $F_2$ and $XeF_2$ Gases; Ellipsometric Strudy," Surface Science, 206–14 (1999).

Habuka, H, et al., "Dominant overall chemical reaction in a chlorine trifluoride–silicon–nitrogen system at atmospheric pressure," Jpn. J.Appl. Phys., (1999) 38 6466–69.

Larson, P.R., et al., "Atomic Fluorine Bean Etching of Silicon and Related Materials," J. Vac. Sci. Tech. B (1999).

* cited by examiner

ON-SITE CLEANING GAS GENERATION FOR PROCESS CHAMBER CLEANING

BACKGROUND OF THE INVENTION

1. Field of the Invention

The present invention relates generally to the field of semiconductor manufacturing. More specifically, the present invention relates to a method of on-site cleaning gas, e.g., $F_2$, generation for semiconductor and/or flat panel display process chamber cleaning, and a method of eliminating HF from $F_2$ generator by, for example, cryo condensation.

2. Description of the Related Art

One of the primary steps in the fabrication of modern semiconductor devices is the formation of a layer or film on a substrate. As is well known in this art, such a layer can be deposited by chemical vapor deposition (CVD). In a conventional plasma-enhanced CVD (PECVD) processes, a controlled plasma is formed using radiofrequency (RF) energy or microwave energy to decompose and/or energize reactive species in reactant gases to produce the desired film.

One problem that arises during such CVD processes is that unwanted deposition occurs on some or all of the processing chamber's interior surfaces, leading to potentially high maintenance costs. With CVD of a desired film onto a substrate, the deposition of undesired residues can occur on any surface, because the reactive gases can diffuse to most parts of the processing chamber, even between cracks and around corners. During subsequent substrate depositions, these residues can accelerate until a continuous film is grown on the undesired parts. Over time, failure to clean the residue from the CVD apparatus often degrades process yield.

When excess deposition starts to interfere with the CVD system's performance, various parts of the chamber can be replaced to remove unwanted accumulations thereon. However, the replacement would potentially increase the maintenance cost. Moreover, such maintenance adversely affects throughput of the CVD system. Therefore, cleaning of the processing chamber is regularly performed to remove such unwanted residues from the chamber walls, heater, and other process kit parts.

Commonly performed between deposition steps for every substrate (or every n substrates), in situ cleaning procedures using one or more cleaning (i.e., etchant) gases are performed to remove the unwanted residual material accumulated during the deposition process. Common cleaning techniques known to those having ordinary skill in this art include thermal, RF plasma, and microwave plasma techniques.

A radiofrequency plasma cleaning process could use nitrogen trifluoride ($NF_3$), for example, because such a technique is capable of imparting the high energies required to dissociate a more stable compound. First, $NF_3$ is flowed into the processing chamber being cleaned. Radiofrequency energy is then applied (e.g., via the substrate processing system's capacitively coupled electrodes), thus generating the fluorine radicals (F*) which remove the unwanted residues from the processing chamber's components. A frequency of 13.56 megahertz (MHz) is commonly used to excite the plasma.

However, the radiofrequency plasma process using $NF_3$ could be costly, as $NF_3$ is very expensive. Other gases such as $SF_6$ and $C_2F_6$ are cheaper, but usually cause significant environmental pollution. Therefore, the prior art is deficient in the lack of effective and economic means of cleaning a semiconductor and/or flat panel display process chamber with minimal environmental pollution. Specifically, the prior art is deficient in the lack of effective means of cleaning a process chamber by generating the cleaning gas, such as, $F_2$ on site and further delivering the cleaning gas to the chamber so that the HF is eliminated from the $F_2$ generator by cryo condensation. The present invention fulfills these long-standing needs and desires in the art.

SUMMARY OF THE INVENTION

Provided herein in one embodiment of the present invention is a method for cleaning a process chamber for semiconductor and/or flat panel display manufacturing. This method comprises the steps of converting a non-cleaning feed gas to a cleaning gas in a remote location and then delivering the cleaning gas to the process chamber for cleaning. This method may further comprise the step of activating the cleaning gas outside the chamber before the delivery of the gas to the chamber.

Also provided herein in another embodiment of the present invention is an alternative method for cleaning a process chamber for semiconductor and/or flat panel display manufacturing. This method comprises the steps of converting a feed gas to a cleaning gas in a remote location, wherein the resulting gas is a mixture of the feed and cleaning gas; transferring the resulting gas mixture to a cold trap, wherein the feed gas is turned into a liquid form, and the cleaning gas remains in a gaseous form; and delivering the cleaning gas to the process chamber for cleaning. This method may further comprise the steps of pumping the cleaning gas into a storage unit and/or activating the cleaning gas outside the chamber before the delivery of the cleaning gas to the chamber.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

DETAILED DESCRIPTION OF THE INVENTION

Provided herein in one embodiment of the present invention is a method of on-site cleaning gas generation for a semiconductor and/or flat panel display process chamber cleaning. A cheap feed stock gas, such as HF may be used instead of the expensive $NF_3$. HF itself does not clean the chamber. However, when HF is electrolyzed, the resulting $F_2$ may be used as a cleaning gas.

To clean the process chamber, the feed gas (e.g. HF) is chemically converted to a cleaning gas ($F_2$) in a remote location (i.e., pump garage area). That is, the $F_2$ cleaning gas is generated on-site. Then $F_2$ is delivered to the chamber for chamber cleaning. Optionally, the cleaning gas $F_2$ can be activated outside the chamber to increase the cleaning efficiency via a remote plasma source (RPS). During the activation, $F_2$ is chemically turned into 2F in the plasma excitation environment.

Figure 1:
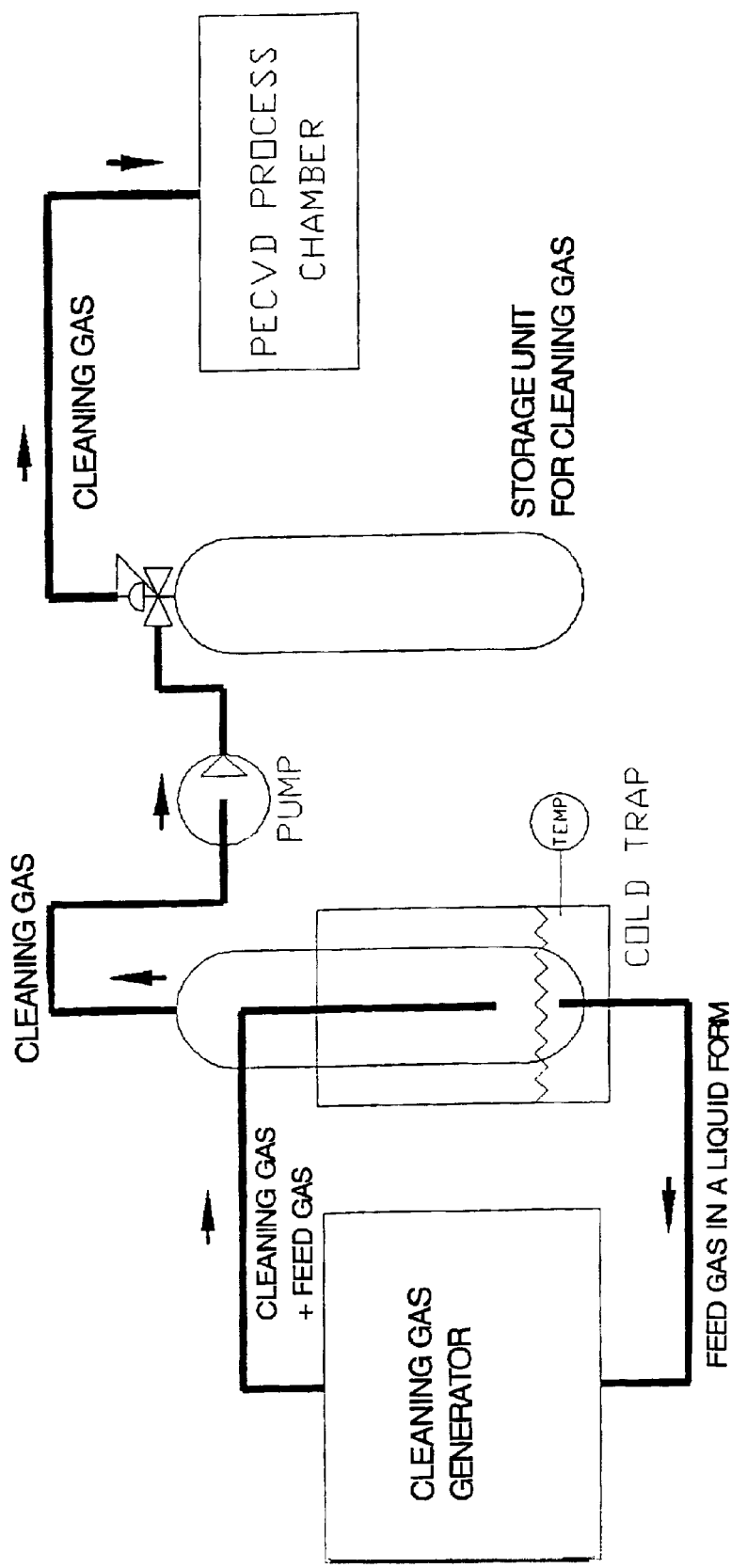
FIG. 1 is a schematic drawing in accordance with one embodiment of the present invention. The feed gas (e.g., HF) is eliminated from the cleaning gas (e.g., $F_2$) generator by cryo condensation, and then the purified cleaning gas is delivered into a storage unit before its arrival to the PECVD process chamber.
Figure 2:
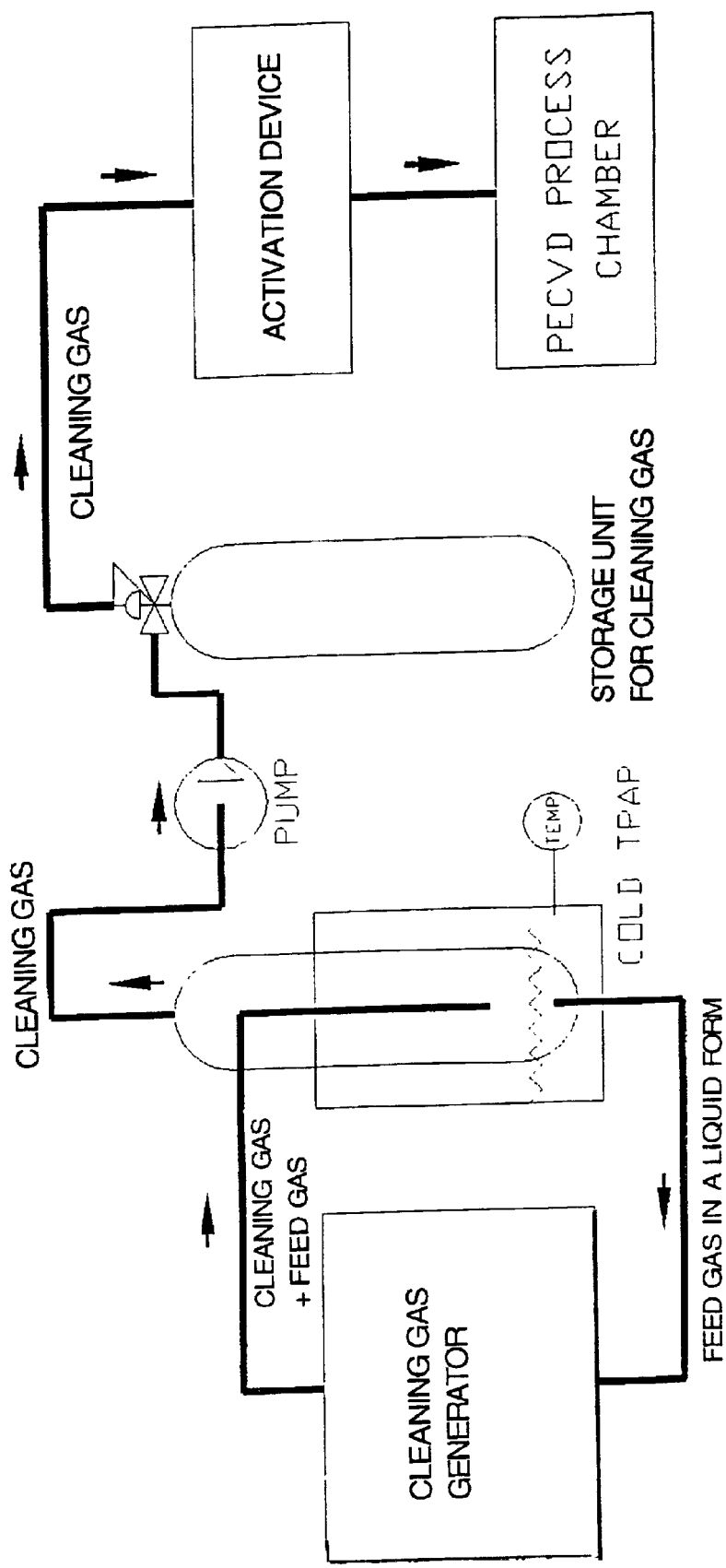
FIG. 2 is a schematic drawing in accordance with another embodiment of the present invention. The feed gas is eliminated from the cleaning gas generator by cryo condensation, and the purified cleaning gas is delivered into a storage unit. The cleaning gas is then activated before its arrival to the PECVD process chamber.

A typical method of generating $F_2$ from HF is electrolysis (HF→$F_2$+$H_2$). After electrolysis, the $F_2$ and HF in gaseous form are transferred from the generator to a cold trap cylinder, wherein the $F_2$ and HF are separated (FIGS. 1 and 2). Specifically, the cold trap turns HF into a liquid form, while $F_2$ is pumped into the 100-liter storage cylinder, and further supplied to the process chamber. The byproduct of the electrolysis $H_2$ is sent to an exhaust system.

The present method reduces the cost of chamber cleaning and eliminates the use of global warming gas. Due to safety concerns, $F_2$ is generated on-demand to minimize the need for storage. However, a mini-storage device can be used. Additionally, the method of eliminating HF from the generated cleaning gas by cryo condensation has several advantages over the state-of-art methods which uses sodium fluoride trap. For example, the changing cold trap does not require any maintenance; and secondly, sodium contamination is eliminated from the gas line.

As described above, provided herein is a method for cleaning a process chamber for semiconductor and/or flat panel display manufacturing. This method comprises the steps of converting a non-cleaning feed gas to a cleaning gas in a remote location and then delivering the cleaning gas to the process chamber for cleaning. Such a method may further comprise the step of activating the cleaning gas outside the chamber before the delivery of the gas to the chamber. Specifically, the activation may be performed through a remote plasma source, a heat source, or an electrical source. Representative examples of a remote plasma source include a microwave energy source or a radiofrequency energy source.

In this method, an example of the non-cleaning feed gas is HF, and the generated cleaning gas is $F_2$. In one aspect, the conversion is done through electrolysis.

Also provided herein in another embodiment of the present invention is an alternative method for cleaning a process chamber for semiconductor and/or flat panel display manufacturing. This method comprises the steps of converting a feed gas to a cleaning gas in a remote location, wherein the resulting gas is a mixture of the feed and cleaning gas; transferring the resulting gas mixture to a cold trap, wherein the feed gas is turned into a liquid form, and the cleaning gas remains in a gaseous form; and delivering the cleaning gas to the process chamber for cleaning. This method may further comprise the steps of pumping the cleaning gas into a storage unit and/or activating the cleaning gas outside the chamber before the delivery of the gas to the chamber. Specifically, the activation may be performed through a remote plasma source, a heat source, or an electrical source. Representative examples of remote plasma sources familiar to those having ordinary skill in this art include a microwave energy source or a radiofrequency energy source.

Further in this method, an example of the non-cleaning feed gas is HF, and the generated cleaning gas is $F_2$. Usually, the conversion is done through electrolysis.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method for cleaning a process chamber located in a processing system for semiconductor and/or flat panel display manufacturing, comprising:
    generating a fluorine cleaning gas from hydrogen fluoride, wherein said fluorine cleaning gas is generated on-site in a generator in communication with the process chamber but remote to the process chamber, said generating comprising:
        converting said hydrogen fluoride to a gas mixture consisting essentially of hydrogen fluoride and said fluorine cleaning gas;
        transferring the gas mixture to a cold trap;
        converting said hydrogen fluoride in said gas mixture into a liquid hydrogen fluoride; and
        removing said liquid hydrogen fluoride from the cold trap, said fluorine cleaning gas remaining in a gaseous form;
    activating said fluorine cleaning gas to form fluorine radicals; and
    cleaning the process chamber with said fluorine radicals.

2. The method of claim 1, wherein said fluorine cleaning gas is pumped into an on-site storage unit prior to said activating said fluorine cleaning gas.

3. The method of claim 1, wherein said fluorine cleaning gas is activated to form fluorine radicals inside the process chamber.

4. The method of claim 1, wherein activating said fluorine cleaning gas is via a plasma source.

5. The method of claim 4, wherein said plasma source is a microwave energy source.

6. The method of claim 1, wherein said converting said hydrogen fluoride is via electrolysis.

7. The method of claim 1, wherein said fluorine cleaning gas is activated to form fluorine radicals outside the process chamber, said fluorine radicals subsequently delivered to the process chamber.

8. The method of claim 1, wherein activating said fluorine cleaning gas is via a heat source.

9. The method of claim 1, wherein activating said fluorine cleaning gas is via an electrical source.

10. The method of claim 4, wherein said plasma source is a radiofrequency energy source.

11. The method of claim 7, wherein activating said fluorine cleaning gas is via a plasma source.

12. The method of claim 7, wherein activating said fluorine cleaning gas is via a heat source.

13. The method of claim 7, wherein activating said fluorine cleaning gas is via an electrical source.

14. The method of claim 11, wherein said plasma source is a microwave energy source.

15. The method of claim 11, wherein said plasma source is a radiofrequency energy source.

16. A method for cleaning a process chamber located in a processing system for flat panel display manufacturing, comprising:

generating a fluorine cleaning gas from hydrogen fluoride, wherein said fluorine cleaning gas is generated on-site in a generator in communication with the process chamber but remote to the process chamber, said generating comprising:

converting said hydrogen fluoride to a gas mixture consisting essentially of hydrogen fluoride and said fluorine cleaning gas;

transferring the gas mixture to a cold trap;

converting said hydrogen fluoride in said gas mixture into a liquid hydrogen fluoride; and removing said liquid hydrogen fluoride from the cold trap, said fluorine cleaning gas remaining in a gaseous form;

activating said fluorine cleaning gas to form fluorine radicals; and cleaning the process chamber with said fluorine radicals.

17. The method of claim 16, wherein said fluorine cleaning gas is pumped into an on-site storage unit prior to said activating said fluorine cleaning gas.

18. The method of claim 16, wherein said fluorine cleaning gas is activated to form fluorine radicals inside the process chamber.

19. The method of claim 16, wherein said fluorine cleaning gas is activated to form fluorine radicals outside the process chamber, said fluorine radicals subsequently delivered to the process chamber.

20. The method of claim 16, wherein said converting said hydrogen fluoride is via electrolysis.

* * * * *

UNITED STATES PATENT AND TRADEMARK OFFICE
CERTIFICATE OF CORRECTION

PATENT NO. : 6,843,258 B2  Page 1 of 1
APPLICATION NO. : 09/741529
DATED : January 18, 2005
INVENTOR(S) : Quanyuan Shang et al.

It is certified that error appears in the above-identified patent and that said Letters Patent is hereby corrected as shown below:

In the Specification

Column 1, Lines 11 and 13: Change both instances of "F.sub.2" to --$F_2$--

Column 1, Lines 55, 57 and 66: Change each instance of "NF.sub.3" to --$NF_3$--

Column 1, Line 67: Change "SF.sub.6" to --$SF_6$--

Column 1, Line 67: Change "C.sub.2" to --$C_2$--

Column 1, Line 67: Change "F.sub.6" to --$F_6$--

Column 2, Lines 7, 9, and 53: Change each instance of "F.sub.2" to --$F_2$--

Column 3, Line 3: Change "NF.sub.3" to --$NF_3$--

Column 3, Lines 5, 7, 8, 9, 11, 13, 15, 17, 18, 20, 26 and 48: Change each instance of "F.sub.2" to --$F_2$--

Column 3, Line 16: Change "F.sub.2+H.sub.2" to --$F_2+H_2$--

Column 3, Line 22: Change "H.sub.2" to --$H_2$--

Column 4, Line 2: Change "F.sub.2" to --$F_2$--

Signed and Sealed this

Third Day of October, 2006

JON W. DUDAS
*Director of the United States Patent and Trademark Office*